(12) United States Patent
Jiang et al.

(10) Patent No.: US 10,914,792 B2
(45) Date of Patent: Feb. 9, 2021

(54) LINEARITY COMPENSATION CIRCUIT AND SENSING APPARATUS USING THE SAME

(71) Applicant: ACEINNA Transducer Systems Co., Ltd., Jiangsu (CN)

(72) Inventors: Leyue Jiang, Jiangsu (CN); Alexander Dribinsky, Naperville, IL (US); Bin Liu, Gibsonia, PA (US); Weize Xu, Acton, MA (US)

(73) Assignee: ACEINNA TRANSDUCER SYSTEMS CO., LTD., Wuxi (CN)

( * ) Notice: Subject to any disclaimer, the term of this patent is extended or adjusted under 35 U.S.C. 154(b) by 413 days.

(21) Appl. No.: 15/959,222

(22) Filed: Apr. 21, 2018

(65) Prior Publication Data

US 2018/0306871 A1    Oct. 25, 2018

(30) Foreign Application Priority Data

Apr. 21, 2017    (CN) .......................... 2017 1 0265265

(51) Int. Cl.
| | |
|---|---|
| *G01R 33/00* | (2006.01) |
| *G01D 5/244* | (2006.01) |
| *G01D 5/14* | (2006.01) |
| *G01D 5/16* | (2006.01) |
| *G01D 3/02* | (2006.01) |

(52) U.S. Cl.
CPC .......... *G01R 33/0017* (2013.01); *G01D 3/02* (2013.01); *G01D 5/142* (2013.01); *G01D 5/16* (2013.01); *G01D 5/2448* (2013.01)

(58) Field of Classification Search
CPC ........ G01D 5/142; G01D 5/16; G01D 5/2448; G01D 3/02; G01R 33/0017

USPC ......................................................... 327/510
See application file for complete search history.

(56) References Cited

U.S. PATENT DOCUMENTS 4,459,858 A * 7/1984 Marsh ...................... G01F 1/58
                                                          73/861.12

FOREIGN PATENT DOCUMENTS

CN        102628886 A      8/2012

OTHER PUBLICATIONS

State Intellectual Property Office, First Office Action for Chinese Patent Application No. 201710265265.8, dated Feb. 28, 2019.

* cited by examiner

*Primary Examiner* — Tomi Skibinski
(74) *Attorney, Agent, or Firm* — EcoTech Law Group, P.C.

(57) ABSTRACT

A linearity compensation circuit is disclosed for improving the linearity of a sensing signal. The linearity compensation circuit may include a compensator that is capable of receiving a sensing signal from a sensor and generating a compensation signal based on the sensing signal. The linearity compensation circuit may also include an output circuit that is capable of combining the compensation signal and the sensing signal to generate a compensated signal that exhibits an improved linearity. Also disclosed is a sensing apparatus which includes a sensor and the linearity compensation circuit. The sensing apparatus may thus be able to generate a sensing signal that is linear over a wider dynamic range.

17 Claims, 3 Drawing Sheets

LINEARITY COMPENSATION CIRCUIT AND SENSING APPARATUS USING THE SAME

CROSS-REFERENCE TO RELATED APPLICATION

The present disclosure claims the priority benefit of China Patent Application No. 201710265265.8, filed on Apr. 21, 2017, which is hereby incorporated by reference in its entirety.

TECHNICAL FIELD

The present disclosure generally relates to techniques of sensing instrument and, more particularly, to a linearity compensation circuit and a sensing apparatus using the same.

BACKGROUND

Linear sensors, such as magnetic sensors, are widely used in various fields such as consumer, industrial, automotive and medical applications. Popular magnetic sensing techniques may include Hall Effect, Anisotropic Magneto-resistance (AMR), Giant Magneto-resistance (GMR), Tunneling Magneto-resistance (TMR), as well as Magneto Impedance (MI). Nevertheless, these magnetic field sensors, when operating in a magnetic field that is stronger than some threshold intensity, may start to deviate from a desired, linear characteristic and exhibit nonlinear characteristics. That is, a magnetic field sensor may no longer generate an output that changes proportionally with a change in the magnetic field to which the magnetic field sensor is exposed, especially when the magnetic field is beyond certain threshold intensity.

In general, a transfer function of a magnetic field sensor may be expressed as:

$$S(H)=\beta_0+\beta_1*H+\beta_2*H^2+\beta_3*H^3+ \ldots =\Sigma_{i=0}^{m}\beta_i*H^i \qquad (1),$$

wherein S(H) represents a sensing signal generated by the magnetic field sensor as an output, H represents an intensity of a magnetic field to which the magnetic sensor is exposed, $\beta_i$ represents a coefficient of each term in a polynomial, and in is a quantity of the terms in the polynomial. It is to be noted that the higher-order terms (e.g., a second-order term, a third-order term and other terms having an order higher than three) in the transfer function may cause the magnetic field sensor to exhibit nonlinear characteristics, which may be undesired. The higher-order terms may be more eminent when the intensity of the magnetic field exceeds certain threshold value.

Therefore, a new solution is required to solve the aforementioned problem.

SUMMARY

This section is for the purpose of summarizing some aspects of the present disclosure and to briefly introduce some preferred embodiments. Simplifications or omissions in this section as well as in the abstract or the title of this description may be made to avoid obscuring the purpose of this section, the abstract and the title. Such simplifications or omissions are not intended to limit the scope of the present disclosure.

An aspect of the present disclosure is to provide a sensing apparatus that exhibits a wide dynamic range of linear sensing.

Another aspect of the present disclosure is to provide a linearity compensation circuit capable of compensating for a nonlinear characteristic of a sensing signal, resulting in a compensated sensing signal that exhibits an improved linearity.

According to an aspect of the present disclosure, a linearity compensation circuit is provided. The linearity compensation circuit may include a compensator, which is capable of receiving a sensing signal from a sensor and generating a compensation signal based on the sensing signal. The linearity compensation circuit may also include an output circuit, which is capable of combining the compensation signal and the sensing signal to generate a compensated signal.

In some embodiments, the compensator may include a multiplier. The multiplier may have a first input terminal that receives the sensing signal, a second input terminal that also receives the sensing signal, and an output terminal. The multiplier may be capable of performing a multiplication operation of multiplying the sensing signal received at the first input terminal with the sensing signal received at the second input terminal and further with a multiplication coefficient of the multiplier. The multiplier may be further capable of generating an output signal at the output terminal of the multiplier, and the output signal may represent or otherwise be associated with a result of the multiplication operation. The output terminal of the multiplier may serve as an output terminal of the compensator, and the output signal of the multiplier may be the compensation signal of the compensator.

In some embodiments, the compensator may include an adder, as well as a plurality of multipliers that are connected in a cascade. Each of the multipliers may have or otherwise be associated with a respective multiplication coefficient. Each of the multipliers may have a first input terminal, a second input terminal and an output terminal, and may be capable of performing a multiplication operation of multiplying a first signal received at the first input terminal with a second signal received at the second input terminal and further with the respective multiplication coefficient. In addition, each of the multipliers may be further capable of generating an output signal at the output terminal, and the output signal may represent a result of the multiplication operation. The first multiplier in the cascade may receive the sensing signal at each of its first and second input terminals, and the rest of the multipliers may receive the sensing signal at the first input terminal only. For the rest of the multipliers, each one may have its respective second terminal coupled to the output terminal of the multiplier that is immediately prior to the respective multiplier in the cascade. The adder may perform an addition operation that sums one or more output signals of the plurality of multipliers. The adder may also generate an output signal at an output terminal of the adder. The output terminal of the adder may serve as an output terminal of the compensator, and the output signal of the adder may be the compensation signal of the compensator.

In some embodiments, each multiplier may also have a control terminal to receive a coefficient control signal. The coefficient control signal may set or otherwise determine the multiplication coefficient for the multiplier. Namely, the multiplication coefficient of a multiplier is adjustable and may be adjusted by adjusting the coefficient control signal received at the control terminal of the multiplier.

Preferably, each of the plurality of multipliers may be a fully differential analog multiplier. That is, each of the sensing signal, the coefficient control signal and the compensation signal may be a differential signal. For example, the first input terminal of such a multiplier may include a first positive differential input terminal and a first negative differential input terminal. Similarly, the second input terminal may include a second positive differential input terminal and a second negative differential input terminal. Likewise, the control terminal may include a positive differential control terminal and a negative differential control terminal. The output terminal may include a positive differential output terminal and a negative differential output terminal of the respective multiplier. The sensing signal may include a positive differential sensing signal and a negative differential sensing signal. The first positive differential input terminal may receive the positive differential sensing signal, and the first negative differential input terminal may receive the negative differential sensing signal. The second positive differential input terminal may either receive the positive differential sensing signal (if the multiplier is the first multiplier in the cascade) or be coupled to the positive differential output terminal of an immediately prior multiplier in the cascade (if the multiplier is not the first multiplier in the cascade). Similarly, the second negative differential input terminal may either receive the negative differential sensing signal (if the multiplier is the first multiplier in the cascade) or be coupled to the negative differential output terminal of an immediately prior multiplier in the cascade (if the multiplier is not the first multiplier in the cascade). The coefficient control signal may include a positive differential coefficient control signal, which may be received at the positive differential control terminal, and a negative differential coefficient control signal, which may be received at the negative differential control terminal. The output terminal of the compensator may include a positive differential output terminal and a negative differential output terminal. Similarly, the compensation signal may include a positive differential compensation signal and a negative differential compensation signal.

In some embodiments, the output circuit of the linearity compensation circuit may include a first resistor, a second resistor, a third resistor, a fourth resistor, a fifth resistor, a sixth resistor and a first operational amplifier. The first operational amplifier may have a first input terminal, a second input terminal, a first output terminal and a second output terminal. In particular, the first and second output terminals of the first operational amplifier may differentially output the compensated sensing signal. The positive differential output terminal of the compensator may couple to the second input terminal of the first operational amplifier via the third resistor, and the negative differential output terminal of the compensator may couple to the first input terminal of first operational amplifier via the fourth resistor. In addition, the positive differential sensing signal may couple to the second input terminal of the first operational amplifier via the first resistor, and the negative differential sensing signal may couple to the first input terminal of the first operational amplifier via the second resistor. The second input terminal and the first output terminal of first operational amplifier may be coupled to one another via the fifth resistor, and the first input terminal and the second output terminal of first operational amplifier may be coupled to one another via the sixth resistor.

According to another aspect of the present disclosure, a sensing apparatus is provided. The sensing apparatus may include a sensor that is capable of generating a sensing signal. The sensing apparatus may also include a linearity compensation circuit such as one disclosed above. The linearity compensation circuit may be able to generate a compensated sensing signal based on the sensing signal, and thus improve the overall linearity of the sensing apparatus. In some embodiments, the sensor of the sensing apparatus may be a magnetic field sensor.

Compared with existing technology, the linearity compensation circuit according to the present disclosure is capable of performing a linearity compensation to a sensing signal generated by a sensor wherein the sensing signal may exhibit certain degrees of nonlinearity. A compensation signal is generated based on the sensing signal, and subsequently combined with the sensing signal to yield a compensated signal, which has a significantly improved linearity as compared to the sensing signal.

BRIEF DESCRIPTION OF THE DRAWINGS

These and other features, aspects, and advantages of the present disclosure will become better understood with regard to the following description, appended claims, and accompanying drawings.

DETAILED DESCRIPTION OF THE PREFERRED EMBODIMENTS

The detailed description of the present disclosure is presented largely in terms of procedures, steps, logic blocks, processing, or other symbolic representations that directly or indirectly resemble the operations of devices or systems contemplated in the present disclosure. These descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be comprised in at least one embodiment of the present disclosure. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams or the use of sequence numbers representing one or more embodiments of the present disclosure do not inherently indicate any particular order nor imply any limitations in the present disclosure.

A linearity compensation circuit according to the present disclosure is further explained and described below with reference to the accompany drawings. The linearity compensation circuit is capable of performing a linearity compensation to a sensing signal generated by a sensor wherein the sensing signal may exhibit certain degrees of nonlinearity, thereby significantly improving a linearity of the sensing signal after the linearity compensation.

Figure 1:
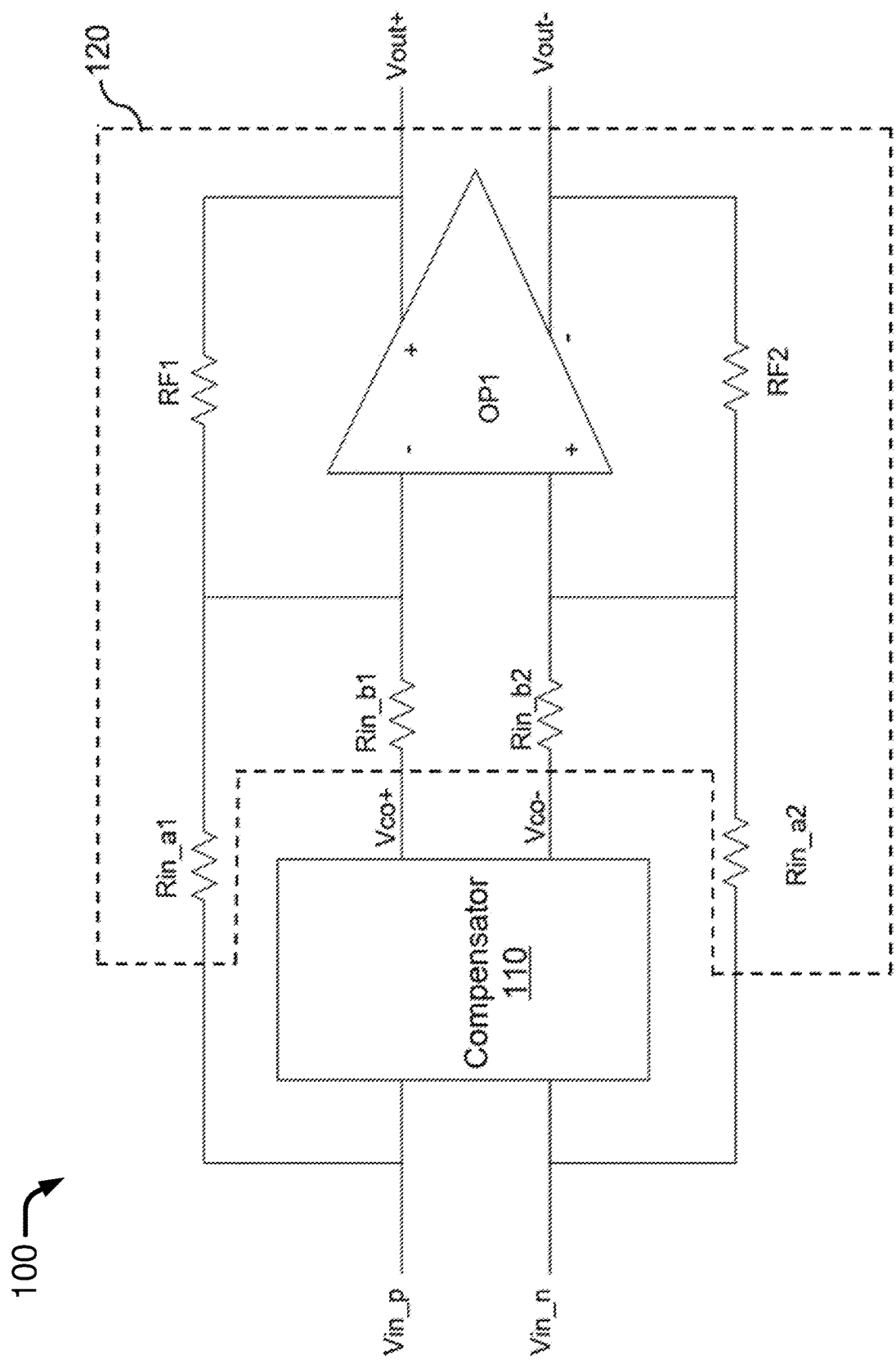
FIG. 1 is a schematic diagram illustrating a linearity compensation circuit according to an embodiment of the present disclosure.

FIG. 1 illustrates a schematic circuit diagram of a linearity compensation circuit 100 according to one embodiment of the present invention. As shown in FIG. 1, linearity compensation circuit 100 includes a compensator 110 and an output circuit 120.

Compensator 110 may receive a sensing signal from a sensor (not shown in FIG. 1) and accordingly generate a compensation signal based on the sensing signal. Output circuit 120 may combine the compensation signal and the sensing signal, or otherwise condition the sensing signal with the compensation signal, to generate a compensated signal. The sensing signal from the sensor may exhibit a nonlinear characteristic, which may be represented by a multi-order polynomial function. Specifically, one or more higher-order terms of the multi-order polynomial function may represent the nonlinearity (i.e., the nonlinear characteristic) of the sensing signal.

In some embodiments, the sensing signal generated by the sensor may be a differential signal. For example, as shown in FIG. 1, the sensing signal may consist of a positive differential sensing signal Vin_p and a negative differential sensing signal Vin_n. The compensation signal may also be a differential signal. For example, as shown in FIG. 1, the compensation signal may consist of a positive differential compensation signal Vco+ and a negative differential compensation signal Vco−. Compensator 110 may include a positive differential input terminal, a negative differential input terminal, a positive differential output terminal and a negative differential output terminal. The positive differential input terminal of compensator 110 may receive positive differential sensing signal Vin_p, and the negative differential input terminal of compensator 110 may receive negative differential sensing signal Vin_n. Moreover, the positive differential output terminal of compensator 110 may output positive differential compensation signal Vco+, and the negative differential output terminal of compensator 110 may output negative differential compensation signal Vco−. The compensated signal may also be a differential signal, which, as shown in FIG. 1, may include a positive differential compensated signal Vout+ and a negative differential compensated signal Vout−. In some embodiments, the sensor may be a magnetic field sensor, such as an AMR magnetic field sensor, a GMR magnetic field sensor, a TMR magnetic field sensor or an MI magnetic field sensor. In some embodiments, a sensing signal generated by a magnetic field sensor may be a differential voltage signal.

In some embodiments, output circuit 120 may include a first resistor Rin_a1, a second resistor Rin_a2, a third resistor Rin_b1, a fourth resistor Rin_b2, a fifth resistor RF1, a sixth resistor RF2, as well as a first operational amplifier OP1, as shown in FIG. 1. In some embodiments, first operational amplifier OP1 may include a first input terminal (labeled "+" and closer to compensator 110 in FIG. 1), a second input terminal (labeled "−" and closer to compensator 110 in FIG. 1), a first output terminal (labeled "+" and farther away from compensator 110 in FIG. 1), as well as a second output terminal (labeled "−" and farther away from compensator 110 in FIG. 1). Moreover, the first output terminal and the second output terminal of first operational amplifier OP1 may output positive differential compensated signal Vout+ and negative differential compensated signal Vout−, respectively. In addition, the positive differential output terminal of compensator 110 may couple to the second input terminal of first operational amplifier OP1 via third resistor Rin_b1, and the negative differential output terminal of compensator 110 may couple to the first input terminal of first operational amplifier OP1 via fourth resistor Rin_b2. Positive differential sensing signal Vin_p from the sensor may couple to the second input terminal of first operational amplifier OP1 via first resistor Rin_a1, and negative differential sensing signal Vin_n from the sensor may couple to the first input terminal of first operational amplifier OP1 via second resistor Rin_a2. Furthermore, the second input terminal and the first output terminal of first operational amplifier OP1 may be coupled to one another via fifth resistor RF1, and the first input terminal and the second output terminal of first operational amplifier OP1 may be coupled to one another via sixth resistor RF2. In some embodiments, first resistor Rin_a1 may have a same resistance value as second resistor Rin_a2, third resistor Rin_b1 may have a same resistance value as fourth resistor Rin_b2, and fifth resistor RF1 may have a same resistance value as sixth resistor RF2.

In some embodiments, a transfer function of compensator 110 may be expressed as:

$$V_{CO} = \sum_{i=1}^{n} \alpha_i * V_{in}^{1+i} \quad (2).$$

In equation (2), Vco represents compensation signal generated by compensator 110, which equals to a difference between positive differential compensation signal Vco+ and negative differential compensation signal Vco− (i.e., Vco=Vco+−Vco−). $V_{in}$ represents the sensing signal at the input of the compensator, which equals to a difference between positive differential sensing signal Vin_p and negative differential sensing signal Vin_n (i.e., $V_{in}$=Vin_p+−Vin_n). In addition, in equation (2), $\alpha_i$ is a coefficient of an ith term of the transfer function, and n is a quantity (i.e., a total number) of terms of the transfer function, wherein n is an integer that is greater than or equal to one.

In some embodiments, the quantity of terms and the coefficient of each respective term may be set or otherwise determined according to the nonlinear characteristic of the sensing signal.

Accordingly, a transfer function of linearity compensation circuit 100 of FIG. 1 may be represented as:

$$V_{out} = \frac{RF}{Rin\_a} * V_{in} + \frac{RF}{Rin\_b} * V_{CO} = \frac{RF}{Rin\_a} * V_{in} + \frac{RF}{Rin\_b} * \left( \sum_{i=1}^{n} \alpha_i * V_{in}^{1+i} \right), \quad (3)$$

wherein RF is a resistance value of each of fifth resistor RF1 and sixth resistor RF2, Rin_a is a resistance value of each of first resistor Rin_a1 and second resistor Rin_a2, and wherein Rin_b is a resistance value of each of third resistor Rin_b1 and fourth resistor Rin_b2. Moreover, Vout represents compensated signal generated by output circuit 120, which equals to a difference between positive differential compensated signal Vout+ and negative differential compensated signal Vout− (i.e., Vout=Vout+−Vout−).

That is, according to equation (2), output circuit 120 may perform a first gain amplification on sensing signal $V_{in}$ (i.e., with a gain of RF/Rin_a) and a second gain amplification on compensation signal Vco (i.e., with a gain of RF/Rin_b), respectively, and then combine the two to obtain the compensated signal Vout. Since, in some embodiments, compensation signal Vco may be a higher-order polynomial function related to sensing signal $V_{in}$, linearity compensation circuit 100 may thus improve the linearity of the compensated signal Vout by adding compensation signal Vco to sensing signal $V_{in}$.

Figure 2:
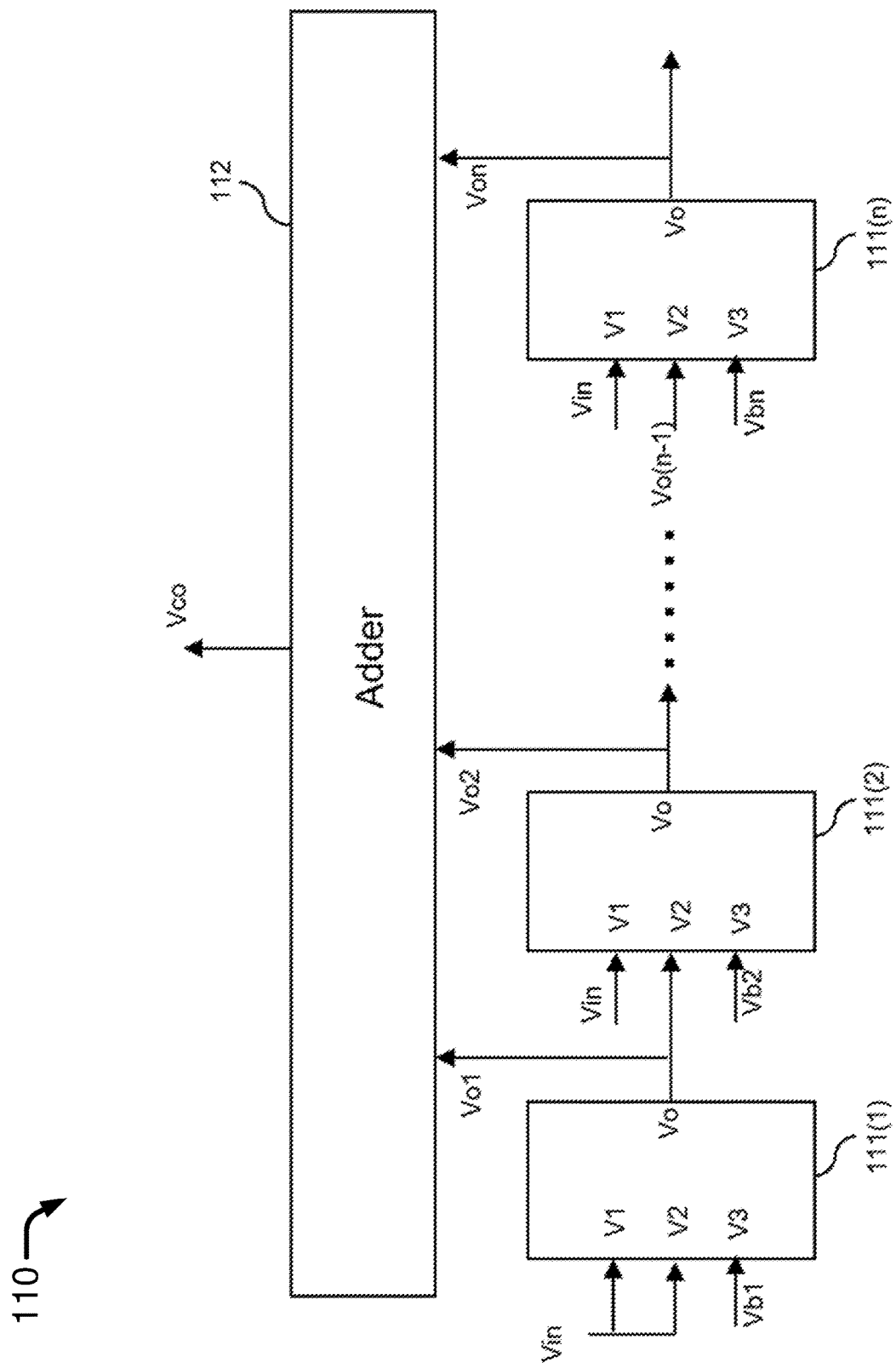
FIG. 2 is a structural block diagram of a compensator of FIG. 1 according to an embodiment of the present disclosure.

FIG. 2 illustrates an example structural block diagram of compensator 110 of FIG. 1 according to one embodiment of the present disclosure. As shown in FIG. 2, compensator 110 may include a plurality of multipliers that are cascaded (i.e., a plurality of multipliers 111(1), 111(2), . . . , and 111(n) that are connected in a cascade), as well as an adder 112. Each multiplier may respectively have a multiplication coefficient. The multiplication coefficients of different multipliers may be different or may be the same. A number of n multipliers are shown in FIG. 2, and n also represents the quantity (i.e., the total number) of terms in the transfer function of compensator 110, as shown in equation (2), wherein n is an integer greater than or equal to one. In some embodiments, n may be equal to 1, meaning compensator 110 consists of only one multiplier, and adder 112 is no longer required (i.e., adder 112 is just a piece of wire in this particular case).

Each multiplier of FIG. 2 may include a first input terminal V1, a second input terminal V2 and an output terminal Vo. Moreover, each multiplier of FIG. 2 may also include a control terminal V3, which may receive a coefficient control signal (such as coefficient control signals Vb1, Vb2 and Vbn of FIG. 2). The coefficient control signal received at control terminal V3 of each multiplier may set the multiplication coefficient of the respective multiplier. That is, by adjusting the coefficient control signal at control terminal V3 of a multiplier, the multiplication coefficient of the multiplier may be adjusted. Functionally, a multiplier may perform a multiplication operation of multiplying a first signal received at first input terminal V1 of the multiplier with a second signal received at second input terminal V2 of the multiplier and further with the multiplication coefficient of the multiplier as set by the coefficient control signal received at control terminal V3 of the multiplier, and then generate an output signal at output terminal Vo that represents a result (i.e., a product) of the multiplication operation.

In some embodiments of compensator 110 wherein n is greater than or equal to two, a first multiplier in the cascade (e.g., multiplier 111(1) in FIG. 2) may receive sensing signal $V_{in}$ at both of its first input terminal V1 and second input terminal V2. Each of the rest of the multipliers in the cascade may receive sensing signal $V_{in}$ only at respective first input terminal V1, whereas second input terminal V2 of each of the rest of the multipliers in the cascade is coupled to output terminal Vo of the previous multiplier in the cascade (i.e., the multiplier that is immediately prior in the cascade), as shown in FIG. 2. For example, second input terminal V2 of multiplier 111(2) is coupled to output terminal Vo of multiplier 111(1), and second input terminal V2 of the nth multiplier 111(n) is coupled to output terminal Vo of the (n−1)th multiplier, i.e., output terminal Vo of the previous multiplier in the cascade.

Each of the multipliers of FIG. 2 may have a transfer function in the form of:

$$Voi = \alpha_i * V_{in}^{1+i} \quad (4),$$

wherein $\alpha_i$ is the multiplication coefficient of the ith multiplier of compensator 110, $V_{in}$ (i.e., Vin_p−Vin_n) is the sensing signal from the sensor, Voi represents an output signal of the ith multiplier (namely, the signal generated by the ith multiplier at the output terminal Vo of the ith multiplier), and i is an integer that is greater than or equal to one and smaller than or equal to n. As stated above, $\alpha_i$ may be set and adjusted through coefficient control signals Vb1, Vb2 and Vbn.

As also shown in FIG. 2, adder 112 may receive output signals Vo1, Vo2, . . . , and Von of the multipliers, perform an addition operation thereof, and generate an output signal at an output terminal of adder 112 that represents a result (i.e., a sum) of the addition operation. The output terminal of the adder may serve as the output terminal of compensator 110, which outputs compensation signal Vco. The structural block diagram of compensator 110, as shown in FIG. 2, is thus capable of realizing the transfer function described in equation (2) above.

Figure 3:
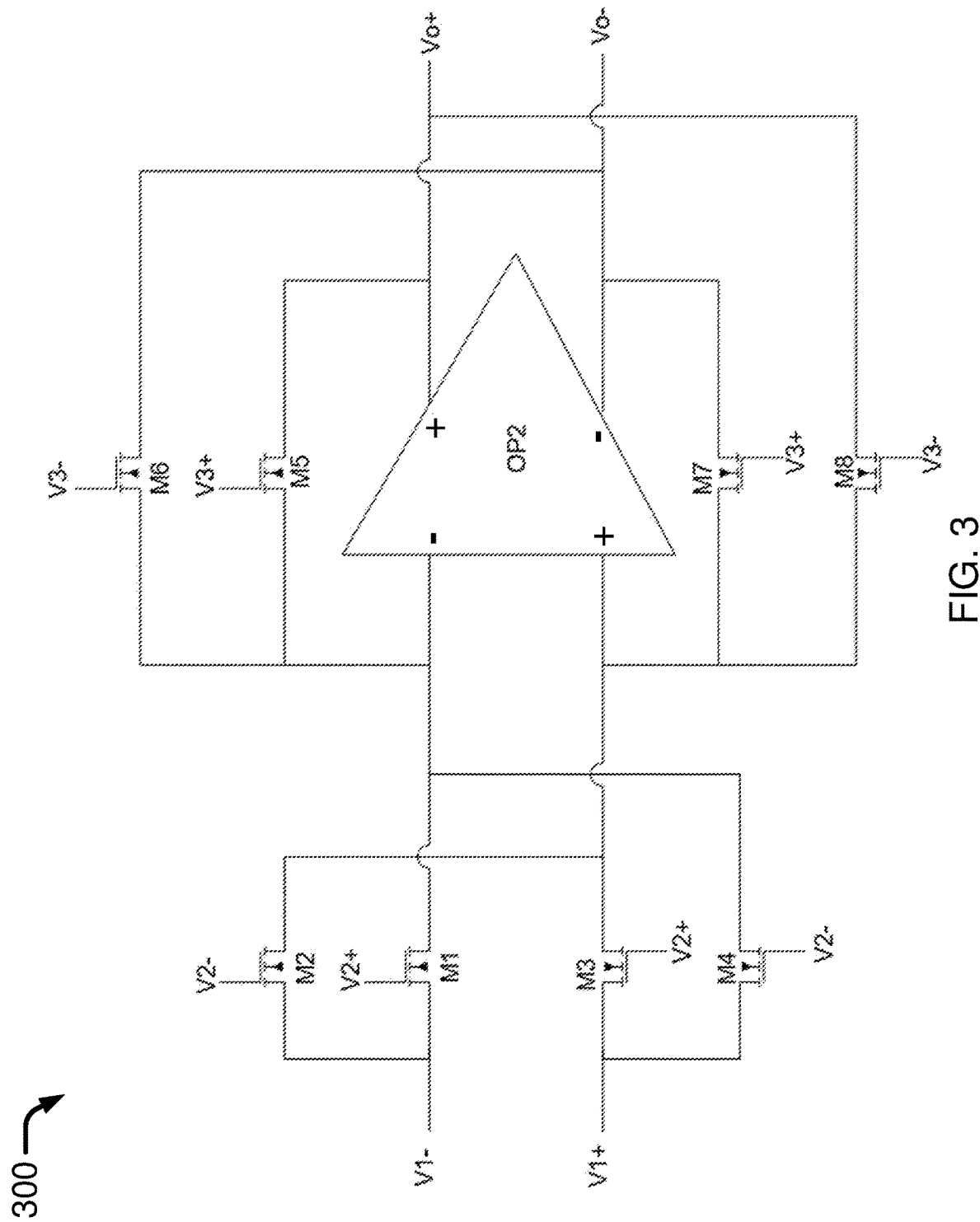
FIG. 3 is a circuit diagram of a multiplier of FIG. 2 according to an embodiment of the present disclosure.

FIG. 3 shows a circuit diagram of a multiplier of FIG. 2 according to one embodiment of the present disclosure. As shown in FIG. 3, multiplier 300 may be a fully differential analog multiplier having the first input terminal V1 (consisting of a first positive differential input terminal V1+ and a first negative differential input terminal V1−), the second input terminal V2 (consisting of a second positive differential input terminal V2+ and a second negative differential input terminal V2−), the control terminal V3 (consisting of a positive differential control terminal V3+ and a negative differential control terminal V3−) and the output terminal Vo (consisting of a positive differential output terminal Vo+ and a negative differential output terminal Vo−).

Specifically, first positive differential input terminal V1+ of multiplier 300 may receive positive differential sensing signal Vin_p of FIG. 1, and first negative differential input terminal V1− of multiplier 300 may receive negative differential sensing signal Vin_n of FIG. 1. In addition, second positive differential input terminal V2+ of multiplier 300 may receive positive differential sensing signal Vin_p of FIG. 1 if multiplier 300 embodies the first multiplier of the cascade of FIG. 2 (e.g., multiplier 111(1) of FIG. 2), or may be coupled to positive differential output terminal Vo+ of the previous multiplier in the cascade if multiplier 300 embodies any but the first multiplier of the cascade of FIG. 2 (e.g., multiplier 111(2), . . . , or 111(n) of FIG. 2). Similarly, second negative differential input terminal V2− of multiplier 300 may receive negative differential sensing signal Vin_n of FIG. 1 if multiplier 300 embodies the first multiplier of the cascade of FIG. 2 (e.g., multiplier 111(1) of FIG. 2), or may be coupled to negative differential signal output terminal Vo− of the previous multiplier in the cascade if multiplier 300 embodies any but the first multiplier of the cascade of FIG. 2 (e.g., multiplier 111(2), . . . , or 111(n) of FIG. 2). Moreover, positive differential control terminal V3+ of multiplier 300 may receive a positive differential coefficient control signal Vbi+, and negative differential control terminal V3− of multiplier 300 may receive a negative differential coefficient control signal Vbi−, wherein a difference between positive differential coefficient control signal Vbi+ and negative differential coefficient control signal Vbi− (i.e., Vbi+−Vbi−) equals to the coefficient control signal of the i-th multiplier of compensator 110 shown in FIG. 2, such as Vb1, Vb2 or Vbn.

The output terminal of adder 112 of FIG. 2 may also include a positive differential output terminal and a negative differential output terminal that are respectively used as the positive differential output terminal (i.e., Vco+ of FIG. 1) and the negative differential output terminal (i.e., Vco− of FIG. 1) of compensator 110.

As shown in FIG. 3, multiplier 300 may include a second operational amplifier OP2, a first field effect transistor (FET) M1, a second FET M2, a third FET M3, a fourth FET M4, a fifth FET M5, a sixth FET M6, a seventh FET M7 and an eighth FET M8.

In some embodiments, second operational amplifier OP2 may include a first input terminal (labeled "+" and closer to FET M3 in FIG. 3), a second input terminal (labeled "−" and closer to FET M1 in FIG. 3), a first output terminal (labeled "+" and farther away from FET M1 in FIG. 3), and a second output terminal (labeled "−" and farther away from FET M3 in FIG. 3). Specifically, first output terminal of second operational amplifier OP2 may be positive differential output terminal Vo+ of multiplier 300, and the second output terminal of second operational amplifier OP2 may be negative differential output terminal Vo− of multiplier 300.

In some embodiments, each of FETs M1, M2, M3, M4, M5, M6, M7 and M8 of multiplier 300 may be a P-channel Metal Oxide Semiconductor (PMOS) transistor or an N-channel Metal Oxide Semiconductor (NMOS) transistor.

Each of FETs M1, M2, M3, M4, M5, M6, M7 and M8 of multiplier 300 may have a first connection terminal, a second connection terminal and a control terminal. The first connection terminal of each FET may be a drain terminal or a source terminal of the respective FET, and the second connection terminal of FET may be a source terminal or a drain terminal of the respective FET. Namely, the first connection terminal may be either the drain or source terminal of the FET, and the second connection terminal would be the other source or drain terminal that is not used as the first connection terminal. This is because, in actual applications, a drain terminal and a source terminal of a FET are functionally interchangeable.

As shown in FIG. 3, the first connection terminal of first FET M1 and the first connection terminal of second FET M2 are coupled together, used as first negative differential input terminal V1− of multiplier 300. The first connection terminal of third FET M3 and the first connection terminal of fourth FET M4 are also coupled together, used as first positive differential input terminal V1+ of multiplier 300. In addition, the second connection terminal of first FET M1 and the second connection terminal of fourth FET M4 are coupled to the second input terminal of second operational amplifier OP2, whereas the second connection terminal of second FET M2 and the second connection terminal of third FET M3 are coupled to the first input terminal of second operational amplifier OP2. Likewise, the first connection terminal of fifth FET M5 and the first connection terminal of sixth FET M6 are coupled to the second input terminal of second operational amplifier OP2, whereas the first connection terminal of seventh FET M7 and the first connection terminal of eighth FET M8 are coupled to the first input terminal of second operational amplifier OP2. Furthermore, the second connection terminal of fifth FET M5 and the second connection terminal of eighth FET M8 are coupled to the first output terminal of second operational amplifier OP2, whereas the second connection terminal of sixth FET M6 and the second connection terminal of seventh FET M7 are coupled to the second output terminal of second operational amplifier OP2.

The control terminal of first FET M1 and the control terminal of third FET M3 are electrically coupled to one another, used as the second positive differential input terminal V2+ of multiplier 300. The control terminal of second FET M2 and the control terminal of fourth FET M4 are also electrically coupled to one another, used as the second negative differential input terminal V2− of multiplier 300. In addition, the control terminal of fifth FET M5 and a control terminal of seventh FET M7 are electrically coupled to one another and used as the positive differential control terminal V3+ of multiplier 300. Also, the control terminal of sixth FET M6 and the control terminal of eighth FET M8 are electrically coupled to one another and used as the negative differential control terminal V3− of multiplier 300.

In an event that the multipliers of FIG. 2 are embodied by multiplier 300 of FIG. 3, the transfer function of each of the multipliers of FIG. 2, as shown in equation (4) above, may be further expressed as:

$$Voi = \alpha_i * V_{in}^{1+i} = \frac{K_{in}}{K_{out} * V_{bi}} * V_{in}^{1+i} = \frac{K_{in}}{K_{out} * \Delta V_3} * \Delta V_1 * \Delta V_2, \quad (5)$$

wherein Voi represents the output signal of the ith multiplier, $\Delta V_1$ represents a difference between a signal level at first positive differential input terminal V1+ of the ith multiplier and a signal level at first negative differential input terminal V1− of the ith multiplier, $\Delta V_2$ represents a difference between a signal level at second positive differential input terminal V2+ of the ith multiplier and a signal level at second negative differential input terminal V2− of the ith multiplier, $\Delta V_3$ represents a difference between a signal level at positive differential control terminal V3+ of the ith multiplier and a signal level at negative differential control terminal V3− of the ith multiplier, $$\alpha_i = \frac{K_{in}}{K_{out} * V_{bi}}$$

is the multiplication coefficient of the ith multiplier, $K_{in}$ is an input conduction parameter of each of the FETs of the ith multiplier, $K_{out}$ is an output conduction parameter of each of the FETs of the ith multiplier, $V_{bi}$ is an coefficient control signal of the ith multiplier, and each of $K_{in}$ and $K_{out}$ is a constant.

For a specific application, the multiplication coefficient, $\alpha_i$, of the each of the multipliers of FIG. 2 may be designed according to a requirement of the specific application. Likewise, the quantity of the multipliers, i, may also be designed according to a requirement of the specific application to be two, three or more.

In some embodiments, compensator 110 may be required to generate a compensation signal that has only a specific term or several specific terms of the multi-order polynomial of equation (2). The specific term or terms that are needed to be realized by compensator 110 as the compensation signal may be selected by adder 112 of FIG. 2. For example, assuming that a third-order term is what is required to be realized by compensator 110 as compensation signal Vco, adder 112 would then only need to keep the output signal of the second multiplier of compensator 110 (i.e., multiplier 111(2) of FIG. 2). Similarly, if only a fourth-order term is required for linearity compensation, adder 112 would only need to keep the output signal of the third multiplier in the cascade of multipliers of FIG. 2.

The present disclosure may further provide a sensing apparatus which includes a sensor and a linearity compensation circuit such as linearity compensation circuit 100 described above. The sensor may generate a sensing signal which serves as the input signal of the linearity compensation circuit.

It should be noted that any modification made by a person skilled in the art to the embodiments disclosed in the present disclosure would still be considered within the scope of the claims of the present application. Accordingly, the scope of the claims of the present application is not limited to the foregoing embodiments.

Additional Notes

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various implementations of the present disclosure have been described herein for purposes of illustration, and that various modifications may be made without departing from the scope and spirit of the present disclosure. Accordingly, the various implementations disclosed herein are not intended to be limiting, with the true scope and spirit being indicated by the following claims.

What is claimed is:

1. A linearity compensation circuit, comprising:
   a compensator comprises a multiplier having a first input terminal receiving a sensing signal, a second input terminal receiving the sensing signal and an output terminal wherein said compensator being capable of receiving a sensing signal from a sensor and generating a compensation signal based on the sensing signal; and
   an output circuit capable of combining the compensation signal and the sensing signal to generate a compensated signal;
   wherein the multiplier is capable of performing a multiplication operation of multiplying the sensing signal received at the first input terminal with the sensing signal received at the second input terminal and further with a multiplication coefficient of the multiplier, wherein the multiplier is further capable of generating an output signal at the output terminal of the multiplier, the output signal representing a result of the multiplication operation, wherein the output terminal of the multiplier serves as an output terminal of the compensator, and wherein the output signal is the compensation signal.

2. The linearity compensation circuit according to claim 1, wherein:
   the compensator comprises an adder and a plurality of multipliers, the plurality of multipliers connected in a cascade, each of the plurality of multipliers associated with a respective multiplication coefficient,
   each of the plurality of multipliers has a first input terminal, a second input terminal and an output terminal, is capable of performing a multiplication operation of multiplying a first signal received at the first input terminal with a second signal received at the second input terminal and further with the respective multiplication coefficient, and is further capable of generating an output signal at the output terminal, the output signal representing a result of the multiplication operation,
   a first multiplier of the plurality of multipliers is configured to receive the sensing signal at each of the first and second input terminals of the first multiplier,
   each but the first multiplier of the plurality of multipliers is configured to receive the sensing signal at the first input terminal of the respective multiplier,
   the second terminal of each but the first multiplier of the plurality of multipliers is coupled to the output terminal of a multiplier of the plurality of multipliers that is immediately prior to the respective multiplier in the cascade, and
   the adder is capable of performing an addition operation of summing one or more output signals of the plurality of multipliers and generating an output signal of the adder at an output terminal of the adder, the output terminal of the adder serving as an output terminal of the compensator, the output signal of the adder being the compensation signal.

3. The linearity compensation circuit according to claim 2, wherein:
each of the plurality of multipliers further has a control terminal receiving a coefficient control signal that sets the multiplication coefficient of the respective multiplier, and
the multiplication coefficient of the respective multiplier is adjustable by adjusting the coefficient control signal received at the control terminal of the respective multiplier.

4. The linearity compensation circuit according to claim 3, wherein:
each of the plurality of multipliers comprises a fully differential analog multiplier,
the first input terminal comprises a first positive differential input terminal and a first negative differential input terminal,
the second input terminal comprises a second positive differential input terminal and a second negative differential input terminal,
the control terminal comprises a positive differential control terminal and a negative differential control terminal,
the output terminal of each of the plurality of multipliers comprises a positive differential output terminal and a negative differential output terminal of the respective multiplier,
each of the sensing signal, the coefficient control signal and the compensation signal comprises a differential signal,
the sensing signal comprises a positive differential sensing signal and a negative differential sensing signal,
the first positive differential input terminal receives the positive differential sensing signal,
the first negative differential input terminal receives the negative differential sensing signal,
the second positive differential input terminal either receives the positive differential sensing signal or is coupled to the positive differential output terminal of an immediately prior multiplier of the plurality of multipliers in the cascade,
the second negative differential input terminal either receives the negative differential sensing signal or is coupled to the negative differential output terminal of an immediately prior multiplier of the plurality of multipliers in the cascade,
the coefficient control signal comprises a positive differential coefficient control signal received by the positive differential control terminal and a negative differential coefficient control signal received by the negative differential control terminal,
the output terminal of the compensator comprises a positive differential output terminal and a negative differential output terminal, and
the compensation signal comprises a positive differential compensation signal and a negative differential compensation signal.

5. The linearity compensation circuit according to claim 4, wherein:
the output circuit comprises a first resistor, a second resistor, a third resistor, a fourth resistor, a fifth resistor, a sixth resistor and a first operational amplifier,
the first operational amplifier has a first input terminal, a second input terminal, a first output terminal and a second output terminal, the first and second output terminals of the first operational amplifier differentially outputting the compensated sensing signal,
the positive differential output terminal of the compensator couples to the second input terminal of the first operational amplifier via the third resistor,
the negative differential output terminal of the compensator couples to the first input terminal of first operational amplifier via the fourth resistor,
the positive differential sensing signal couples to the second input terminal of the first operational amplifier via the first resistor,
the negative differential sensing signal couples to the first input terminal of the first operational amplifier via the second resistor,
the second input terminal and the first output terminal of first operational amplifier are coupled to one another via the fifth resistor, and
the first input terminal and the second output terminal of first operational amplifier are coupled to one another via the sixth resistor.

6. The linearity compensation circuit according to claim 5, wherein:
each of the plurality of multipliers comprises a second operational amplifier, a first field effect transistor (FET), a second FET, a third FET, a fourth FET, a fifth FET, a sixth FET, a seventh FET and an eighth FET,
the second operational amplifier has a first input terminal, a second input terminal, a first output terminal and a second output terminal,
the first output terminal of the second operational amplifier is the positive differential output terminal of the respective multiplier,
the second output terminal of the second operational amplifier is the negative differential output terminal of the respective multiplier,
each of the first, second, third, fourth, fifth, sixth, seventh and eighth FETs has a first connection terminal, a second connection terminal and a control terminal,
the first connection terminal of the first FET and the first connection terminal of the second FET are coupled together and used as the first negative differential input terminal of the respective multiplier,
the first connection terminal of the third FET and the first connection terminal of the fourth FET are coupled together and used as the first positive differential input terminal of the respective multiplier,
the second connection terminal of the first FET and the second connection terminal of the fourth FET are coupled to the second input terminal of the second operational amplifier,
the second connection terminal of the second FET and the second connection terminal of the third FET are coupled to the first input terminal of the second operational amplifier,
the first connection terminal of the fifth FET and the first connection terminal of the sixth FET are coupled to the second input terminal of the second operational amplifier,
the first connection terminal of the seventh FET and the first connection terminal of the eighth FET are coupled to the first input terminal of the second operational amplifier, the second connection terminal of the fifth FET and the second connection terminal of the eighth FET are coupled to the first output terminal of the second operational amplifier, the second connection terminal of the sixth FET and the second connection terminal of the seventh FET are coupled to the second output terminal of the second operational amplifier, the control terminal of the first FET and the control terminal of the third FET are electrically coupled to one another and used as the second positive differential input terminal of the respective multiplier, the control terminal of the second FET and the control terminal of the fourth FET are electrically coupled to one another and used as the second negative differential input terminal of the respective multiplier, the control terminal of the fifth FET and a control terminal of the seventh FET are electrically coupled to one another and used as the positive differential control terminal of the respective multiplier, and the control terminal of the sixth FET and the control terminal of the eighth FET are electrically coupled to one another and used as the negative differential control terminal of the respective multiplier.

7. The linearity compensation circuit according to claim 6, wherein each of the first, second, third, fourth, fifth, sixth, seventh and eighth FETs comprises a P-channel Metal Oxide Semiconductor (PMOS) FET or an N-channel Metal Oxide Semiconductor (NMOS) FET.

8. The linearity compensation circuit according to claim 6, wherein a transfer function of each of the plurality of multipliers is expressed as:

$$Voi = \frac{K_{in}}{K_{out}*V_{bi}} * V_{in}^{1+i} = \frac{K_{in}}{K_{out}*\Delta V_3} * \Delta V_1 * \Delta V_2,$$

wherein:
Vin represents the sensing signal,
Voi represents the output signal of an ith multiplier of the plurality of multipliers, i being an integer that is greater than or equal to one and smaller than or equal to a quantity of the plurality of multipliers,
$\Delta V_1$ represents a difference between a signal level at the first positive differential input terminal of the ith multiplier and a signal level at the first negative differential input terminal of the ith multiplier,
$\Delta V_2$ represents a difference between a signal level at the second positive differential input terminal of the ith multiplier and a signal level at the second negative differential input terminal of the ith multiplier,
$\Delta V_3$ represents a difference between a signal level at the positive differential control terminal of the ith multiplier and a signal level at the negative differential control terminal of the ith multiplier, $$\frac{K_{in}}{K_{out}*V_{bi}}$$

represents the multiplication coefficient of the ith multiplier,
each of the first, second, third, fourth, fifth, sixth, seventh and eighth FETs is associated with an input conduction parameter and an output conduction parameter,
$K_{in}$ represents the input conduction parameter, $K_{out}$ represents the output conduction parameter, and
$V_{bi}$ represents the coefficient control signal of the ith multiplier.

9. The linearity compensation circuit according to claim 8, wherein a transfer function of the compensator is expressed as:

$Vco = E_{i=1}^{l} a_i * V_{1\ in}^{l+i}$, wherein:
Vco represents the compensation signal generated by compensator, and $$\alpha_i = \frac{K_{in}}{K_{out}*V_{bi}}.$$

10. The linearity compensation circuit according to claim 9, wherein a transfer function of the linearity compensation circuit is expressed as:

$$Vout = \frac{RF}{Rin\_a}*V_{in} + \frac{RF}{Rin\_b}*\left(\sum_{i=1}^{n}\alpha_i*V_{in}^{1+i}\right),$$

wherein:
RF represents a resistance value of each of the fifth resistor and the sixth resistor,
Rin_a represents a resistance value of each of the first resistor and the second resistor,
Rin_b represents a resistance value of each of the third resistor and the fourth resistor, and
Vout represents the compensated signal.

11. A sensing apparatus, comprising:
a sensor capable of generating a sensing signal; and
linearity compensation circuit, comprising:
a compensator comprising a multiplier having a first input terminal receiving the sensing signal, a second input terminal receiving the sensing signal and an output terminal, wherein said compensator is capable of receiving the sensing signal and generating a compensation signal based on the sensing signal; and
an output circuit capable of combining the compensation signal and the sensing signal to generate a compensated signal; and
wherein the multiplier is capable of performing a multiplication operation of multiplying the sensing signal received at the first input terminal with the sensing signal received at the second input terminal and further with a multiplication coefficient of the multiplier, wherein the multiplier is further capable of generating an output signal at the output terminal of the multiplier, wherein the output signal representing a result of the multiplication operation, the output terminal of the multiplier serves as an output terminal of the compensator, and wherein the output signal is the compensation signal.

12. The sensing apparatus according to claim 11, wherein the sensor comprises a magnetic field sensor.

13. The sensing apparatus according to claim 11, wherein:
the compensator comprises an adder and a plurality of multipliers connected in a cascade, each of the plurality of multipliers associated with a respective multiplication coefficient,
each of the plurality of multipliers has a first input terminal, a second input terminal and an output terminal, is capable of performing a multiplication operation of multiplying a first signal received at the first input terminal with a second signal received at the second input terminal and further with the respective multiplication coefficient, and is further capable of generating an output signal at the output terminal, the output signal representing a result of the multiplication operation, a first multiplier of the plurality of multipliers is configured to receive the sensing signal at each of the first and second input terminals of the first multiplier, each but the first multiplier of the plurality of multipliers is configured to receive the sensing signal at the first input terminal of the respective multiplier, the second terminal of each but the first multiplier of the plurality of multipliers is coupled to the output terminal of a multiplier of the plurality of multipliers that is immediately prior to the respective multiplier in the cascade, and the adder is capable of performing an addition operation of summing one or more output signals of the plurality of multipliers and generating an output signal of the adder at an output terminal of the adder, the output terminal of the adder serving as an output terminal of the compensator, the output signal of the adder being the compensation signal.

14. The sensing apparatus according to claim 13, wherein:
each of the plurality of multipliers further has a control terminal receiving a coefficient control signal that sets the multiplication coefficient of the respective multiplier, and
the multiplication coefficient of the respective multiplier is adjustable by adjusting the coefficient control signal received at the control terminal of the respective multiplier.

15. The sensing apparatus according to claim 14, wherein:
each of the plurality of multipliers comprises a fully differential analog multiplier,
the first input terminal comprises a first positive differential input terminal and a first negative differential input terminal,
the second input terminal comprises a second positive differential input terminal and a second negative differential input terminal,
the control terminal comprises a positive differential control terminal and a negative differential control terminal,
the output terminal of each of the plurality of multipliers comprises a positive differential output terminal and a negative differential output terminal of the respective multiplier,
each of the sensing signal, the coefficient control signal and the compensation signal comprises a differential signal,
the sensing signal comprises a positive differential sensing signal and a negative differential sensing signal,
the first positive differential input terminal receives the positive differential sensing signal,
the first negative differential input terminal receives the negative differential sensing signal,
the second positive differential input terminal either receives the positive differential sensing signal or is coupled to the positive differential output terminal of an immediately prior multiplier of the plurality of multipliers in the cascade,
the second negative differential input terminal either receives the negative differential sensing signal or is coupled to the negative differential output terminal of an immediately prior multiplier of the plurality of multipliers in the cascade,
the coefficient control signal comprises a positive differential coefficient control signal received by the positive differential control terminal and a negative differential coefficient control signal received by the negative differential control terminal,
the output terminal of the compensator comprises a positive differential output terminal and a negative differential output terminal, and
the compensation signal comprises a positive differential compensation signal and a negative differential compensation signal.

16. The sensing apparatus according to claim 15, wherein:
the output circuit comprises a first resistor, a second resistor, a third resistor, a fourth resistor, a fifth resistor, a sixth resistor and a first operational amplifier,
the first operational amplifier has a first input terminal, a second input terminal, a first output terminal and a second output terminal, the first and second output terminals of the first operational amplifier differentially outputting the compensated sensing signal,
the positive differential output terminal of the compensator couples to the second input terminal of first operational amplifier via the third resistor,
the negative differential output terminal of the compensator couples to the first input terminal of first operational amplifier via the fourth resistor,
the positive differential sensing signal couples to the second input terminal of the first operational amplifier by the first resistor,
the negative differential sensing signal couples to the first input terminal of the first operational amplifier by the second resistor,
the second input terminal and the first output terminal of first operational amplifier are coupled to one another via the fifth resistor, and
the first input terminal and the second output terminal of first operational amplifier are coupled to one another via the sixth resistor.

17. The sensing apparatus according to claim 15, wherein:
each of the plurality of multipliers comprises a second operational amplifier, a first field effect transistor (FET), a second FET, a third FET, a fourth FET, a fifth FET, a sixth FET, a seventh FET and an eighth FET,
the second operational amplifier has a first input terminal, a second input terminal, a first output terminal and a second output terminal,
the first output terminal of the second operational amplifier is the positive differential output terminal of the respective multiplier,
the second output terminal of the second operational amplifier is the negative differential output terminal of the respective multiplier,
each of the first, second, third, fourth, fifth, sixth, seventh and eighth FETs has a first connection terminal, a second connection terminal and a control terminal,
the first connection terminal of the first FET and the first connection terminal of the second FET are coupled together and used as the first negative differential input terminal of the respective multiplier,
the first connection terminal of the third FET and the first connection terminal of the fourth FET are coupled together and used as the first positive differential input terminal of the respective multiplier, the second connection terminal of the first FET and the second connection terminal of the fourth FET are coupled to the second input terminal of the second operational amplifier, the second connection terminal of the second FET and the second connection terminal of the third FET are coupled to the first input terminal of the second operational amplifier, the first connection terminal of the fifth FET and the first connection terminal of the sixth FET are coupled to the second input terminal of the second operational amplifier, the first connection terminal of the seventh FET and the first connection terminal of the eighth FET are coupled to the first input terminal of the second operational amplifier, the second connection terminal of the fifth FET and the second connection terminal of the eighth FET are coupled to the first output terminal of the second operational amplifier, the second connection terminal of the sixth FET and the second connection terminal of the seventh FET are coupled to the second output terminal of the second operational amplifier, the control terminal of the first FET and the control terminal of the third FET are electrically coupled to one another and used as the second positive differential input terminal of the respective multiplier, the control terminal of the second FET and the control terminal of the fourth FET are electrically coupled to one another and used as the second negative differential input terminal of the respective multiplier, the control terminal of the fifth FET and a control terminal of the seventh FET are electrically coupled to one another and used as the positive differential control terminal of the respective multiplier, and the control terminal of the sixth FET and the control terminal of the eighth FET are electrically coupled to one another and used as the negative differential control terminal of the respective multiplier.

* * * * *